(12) United States Patent
Kobayashi et al.

(10) Patent No.: US 11,411,120 B2
(45) Date of Patent: Aug. 9, 2022

(54) METHOD FOR MANUFACTURING SEMICONDUCTOR DEVICE USING PLASMA CVD PROCESS

(71) Applicant: ULVAC, Inc., Chigasaki (JP)

(72) Inventors: Tadamasa Kobayashi, Chigasaki (JP); Hideaki Zama, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 29 days.

(21) Appl. No.: 16/346,243

(22) PCT Filed: Aug. 17, 2018

(86) PCT No.: PCT/JP2018/030517
§ 371 (c)(1),
(2) Date: Apr. 30, 2019

(87) PCT Pub. No.: WO2019/049632
PCT Pub. Date: Mar. 14, 2019

(65) Prior Publication Data
US 2020/0127136 A1  Apr. 23, 2020

(30) Foreign Application Priority Data

Sep. 5, 2017  (JP) .............................. JP2017-170536

(51) Int. Cl.
*H01L 29/786* (2006.01)
*H01L 29/36* (2006.01)
(Continued)

(52) U.S. Cl.
CPC .... *H01L 29/7869* (2013.01); *H01L 21/02274* (2013.01); *H01L 29/36* (2013.01); *H01L 29/66742* (2013.01)

(58) Field of Classification Search
CPC ............... H01L 29/36; H01L 29/66742; H01L 29/7869–78693; H01L 21/02274; H01L 21/02164; H01L 21/02216
See application file for complete search history.

(56) References Cited

U.S. PATENT DOCUMENTS 6,521,912 B1 * 2/2003 Sakama ............... G02B 27/017
257/57
2002/0004262 A1 * 1/2002 Asami ............... H01L 21/02422
438/166
(Continued)

FOREIGN PATENT DOCUMENTS

JP    H07-066196 A    3/1995
JP    2009-141002 A   6/2009
(Continued)

OTHER PUBLICATIONS

"Korean Application Serial No. 1020197013700, Office Action dated Sep. 15, 2020", w/ English Translation, 11 pgs.
(Continued)

*Primary Examiner* — Sophia T Nguyen
*Assistant Examiner* — Scott E Bauman
(74) *Attorney, Agent, or Firm* — Schwegman Lundberg & Woessner, P.A.

(57) ABSTRACT

A method for manufacturing a semiconductor device includes forming a semiconductor layer including an oxide semiconductor as a main component and forming an insulator layer on a surface of the semiconductor layer. The insulator layer includes silicon oside as a main component and has a hydrogen atom concentration that is less than or equal to $1 \times 10^{21}$ atoms/cm$^3$.

5 Claims, 6 Drawing Sheets

(51) Int. Cl.
*H01L 21/02* (2006.01)
*H01L 29/66* (2006.01)

(56) References Cited

U.S. PATENT DOCUMENTS

| | | | |
|---|---|---|---|
| 2009/0232985 A1* | 9/2009 | Dussarrat | H01L 21/02222 |
| | | | 427/255.28 |
| 2010/0283049 A1 | 11/2010 | Sato et al. | |
| 2011/0291092 A1 | 12/2011 | Takemera | |
| 2011/0309355 A1* | 12/2011 | Ichijo | H01L 29/66969 |
| | | | 257/43 |
| 2012/0276292 A1 | 11/2012 | Dussarrat et al. | |
| 2012/0295397 A1 | 11/2012 | Koezuka et al. | |
| 2013/0075719 A1* | 3/2013 | Nakano | H01L 21/02565 |
| | | | 257/43 |
| 2013/0264563 A1* | 10/2013 | Okazaki | H01L 29/78696 |
| | | | 257/43 |
| 2015/0287593 A1* | 10/2015 | Canaperi | C23C 16/401 |
| | | | 257/288 |
| 2016/0047038 A1 | 2/2016 | Canaperi et al. | |
| 2016/0056111 A1 | 2/2016 | Canaperi et al. | |
| 2016/0064218 A1 | 3/2016 | Canaperi et al. | |
| 2016/0064509 A1 | 3/2016 | Canapari et al. | |
| 2020/0212185 A1* | 7/2020 | Yamazaki | H01L 29/26 |
| 2020/0243514 A1* | 7/2020 | Yamazaki | H01L 29/458 |

FOREIGN PATENT DOCUMENTS

| | | |
|---|---|---|
| JP | 2009141002 | 6/2009 |
| JP | 2012-15496 A | 1/2012 |
| JP | 2013-74073 A | 4/2013 |
| JP | 2013070077 | 4/2013 |
| JP | 2013074073 | 4/2013 |
| KR | 20120129795 | 11/2012 |
| WO | WO-2012/169397 A1 | 12/2012 |

OTHER PUBLICATIONS

International Application No. PCT/JP2018/030517, International Search Report (English translation) dated Oct. 23, 2018, 2 pgs.

* cited by examiner

METHOD FOR MANUFACTURING SEMICONDUCTOR DEVICE USING PLASMA CVD PROCESS

CLAIM OF PRIORITY

This application is a U.S. National Stage Filing under 35 U.S.C. 371 from International Application No. PCT/JP2018/030517, filed on Aug. 17, 2018, and published as WO 2019/049632 A1 on Mar. 14, 2019, which claims the benefit of priority to Japanese Patent Application No. 2017-170536, filed on Sep. 5, 2017, each of which is incorporated by reference herein in its entirety.

TECHNICAL FIELD

The present invention relates to a semiconductor device that includes a semiconductor layer, the main component of which is an oxide semiconductor, and a method for manufacturing the semiconductor device.

BACKGROUND ART

A known structure of a thin-film transistor including a semiconductor layer, the main component of which is an oxide semiconductor, includes a semiconductor layer and an insulator layer arranged on the semiconductor layer. The semiconductor layer is arranged on a gate insulator layer that covers a gate electrode. A metal layer is arranged on the insulator layer and a portion of the semiconductor layer that is not covered by the insulator layer. When a source electrode and a drain electrode are formed from the metal layer, the insulator layer functions as an etching stopper layer. Such an insulator layer is, for example, a silicon oxide ($SiO_2$) layer (for example, refer to patent document 1).
Patent Document 1: Internal Patent Publication No. 2012/169397

SUMMARY OF THE INVENTION

A silicon oxide layer may be formed using a plasma CVD process. When a silicon oxide layer is formed, one of silane ($SiH_4$) and tetraethoxysilane (TEOS) is often used as the material of the silicon oxide layer. Since these materials contain hydrogen, the oxide silicon layer formed on a semiconductor layer also contains hydrogen. In boundary surfaces of the silicon oxide layer and the semiconductor layer, hydrogen disperses from the silicon oxide layer toward the semiconductor layer and reduces the semiconductor layer. This results in a deficiency of oxygen in the semiconductor layer. Such oxygen deficiency in a semiconductor layer causes a thin-film transistor including the semiconductor layer, ultimately, a semiconductor device including the thin-film transistor, to have unstable characteristics. Thus, there is a demand for a process for manufacturing a semiconductor device having better stabilized characteristics.

It is an object of the present invention to provide a semiconductor device and a method for manufacturing a semiconductor device that stabilize the characteristics of the semiconductor device.

One aspect is a method for manufacturing a semiconductor device. The method includes forming a semiconductor layer having a surface and including an oxide semiconductor as a main component and forming an insulator layer on the surface of the semiconductor layer. The insulator layer includes silicon oxide as a main component and has a hydrogen atom concentration that is less than or equal to $1 \times 10^{21}$ atoms/cm$^3$.

Another aspect is a semiconductor device. The semiconductor device includes s semiconductor layer having a surface and including an oxide semiconductor as a main component and an insulator layer arranged on the surface of the semiconductor layer. The insulator layer includes silicon oxide as a main component and has a hydrogen atom concentration that is less than or equal to $1 \times 10^{21}$ atoms/cm$^3$.

The inventors have contemplated semiconductor devices that include a semiconductor layer and an insulator layer arranged on the semiconductor layer and found the following. More specifically, the inventors found that in an insulator layer including silicon oxide as a main component, when the concentration of hydrogen atoms is less than or equal to $1 \times 10^{21}$ atoms/cm$^3$, the oxygen deficiency in the semiconductor layer is significantly limited as compared to when the concentration of hydrogen atoms is greater than $1 \times 10^{21}$ atoms/cm$^3$. This stabilizes the characteristics of the semiconductor device. In this regard, with the configuration described above, an insulator layer is formed to have a hydrogen atom concentration that is less than or equal to $1 \times 10^{21}$ atoms/cm$^3$. Thus, the characteristics of the semiconductor device are stabilized.

In the method for manufacturing a semiconductor device described above, the forming of the semiconductor layer may include forming at least one semiconductor layer including an oxide semiconductor as a main component. In this case, the main component of the at least one semiconductor layer may be any one of: an oxide semiconductor including indium (In) and oxygen (O); and an oxide semiconductor including zinc (Zn) and oxygen (O). For example, the main component of the at least one semiconductor layer may be any one selected from a group consisting of InGaZnO, GaZnO, InZnO, InTiZnO, InAlZnO, ZnTiO, ZnO, ZnAlO, and ZnCuO.

Thus, in the semiconductor device described above, the semiconductor layer may include at least one semiconductor layer including an oxide semiconductor as a main component. In this case, the main component of the at least one semiconductor layer may be any one of: an oxide semiconductor including indium (In) and oxygen (O); and an oxide semiconductor including zinc (Zn) and oxygen (O). For example, the main component of the at least one semiconductor layer may be any one selected from a group consisting of InGaZnO, GaZnO, InZnO, InTiZnO, InAlZnO, ZnTiO, ZnO, ZnAlO, and ZnCuO.

In the above configuration, when the main component of the semiconductor layer is an oxide semiconductor selected from the group described above, the characteristics of the semiconductor device are stabilized.

In the method for manufacturing a semiconductor device described above, the forming of the insulator layer may include forming the insulator layer through a plasma CVD process using a source gas and an oxygen-containing gas. In this case, preferably, the source gas contains silicon and an isocyanate group and does not contain hydrogen.

In the above configuration, the source gas, which is the material of the insulator layer, does not contain hydrogen. This increases the reliability of the hydrogen atom concentration of the insulator layer being less than or equal to $1 \times 10^{21}$ atoms/cm$^3$.

In the method for manufacturing a semiconductor device described above, the forming of the insulator layer may include using any one selected from a group consisting of $Si(NCO)_4$, $Si(NCO)_3Cl$, $Si(NCO)_2Cl_2$, and $Si(NCO)Cl_3$ as the source gas.

In the method for manufacturing a semiconductor device described above, the forming of the insulator layer may include using any one selected from a group consisting of $O_2$, $O_3$, $N_2O$, CO, and $CO_2$ as the oxygen-containing gas.

Preferably, in the method for manufacturing a semiconductor device described above, the forming of the insulator layer includes generating a mixed gas by supplying the source gas and the oxygen-containing gas to a film formation space in which the insulator layer is formed and generating plasma from the mixed gas by supplying power to an electrode arranged in the film formation space.

In the above configuration, from the point in time when plasma is generated, active species that are generated from the source gas is oxidized by active species that are generated from oxygen gas.

Preferably, in the method for manufacturing a semiconductor device described above, the forming of the insulator layer includes using tetraisocyanatesilane gas as the source gas and setting a ratio of the power supplied to the electrode to a flow rate of the tetraisocyanatesilane gas to be greater than or equal to 17 W/sccm.

The inventors have contemplated methods for manufacturing a semiconductor device and found the following. More specifically, when an insulator layer is formed through a plasma CVD process using tetraisocyanatesilane gas and oxygen gas, if the ratio of power supplied to the electrode to the flow rate of tetraisocyanatesilane gas is greater than or equal to 17 W/sccm, the reliability of the concentration of hydrogen atoms in an insulator layer being less than or equal to $1 \times 10^{21}$ atoms/cm$^3$ is increased. In this regard, with the above configuration, the reliability of forming an insulator layer having a hydrogen gas concentration that is less than or equal to $1 \times 10^{21}$ atoms/cm$^3$ is increased.

DESCRIPTION OF THE EMBODIMENTS

Embodiments of a semiconductor device and a method for manufacturing a semiconductor device will now be described with reference to FIGS. 1 to 12. Hereafter, a method for manufacturing a semiconductor device, the structure of a thin-film transistor, a test example, and an example will be described in this order.

[Method for Manufacturing Semiconductor Device]

A method for manufacturing a semiconductor device will now be described with reference to FIGS. 1 and 2.

The method for manufacturing a semiconductor device includes forming a semiconductor layer and forming an insulator layer. The forming of a semiconductor layer includes forming a semiconductor layer having a surface and including an oxide semiconductor as a main component. The forming of an insulator layer includes forming an insulator layer on the surface of the semiconductor layer. The insulator layer includes silicon oxide ($SiO_2$) as a main component and has a hydrogen atom concentration that is less than or equal to $1 \times 10^{21}$ atoms/cm$^3$.

These processes form an insulator layer having a hydrogen atom concentration that is less than or equal to $1 \times 10^{21}$ atoms/cm$^3$. Thus, the characteristics of the semiconductor device are stabilized.

The configuration of a sputtering apparatus, which is an example of an apparatus used to form a semiconductor layer, will now be described with reference to FIG. 1. The configuration of a plasma CVD apparatus, which is an example of an apparatus used to form an insulator layer, will be described with reference to FIG. 2. An apparatus other than a sputtering apparatus may be used to form a semiconductor layer including an oxide semiconductor as a main component such as that described above. Also, an apparatus other than a plasma CVD apparatus may be used to form the insulator layer.

Figure 1:
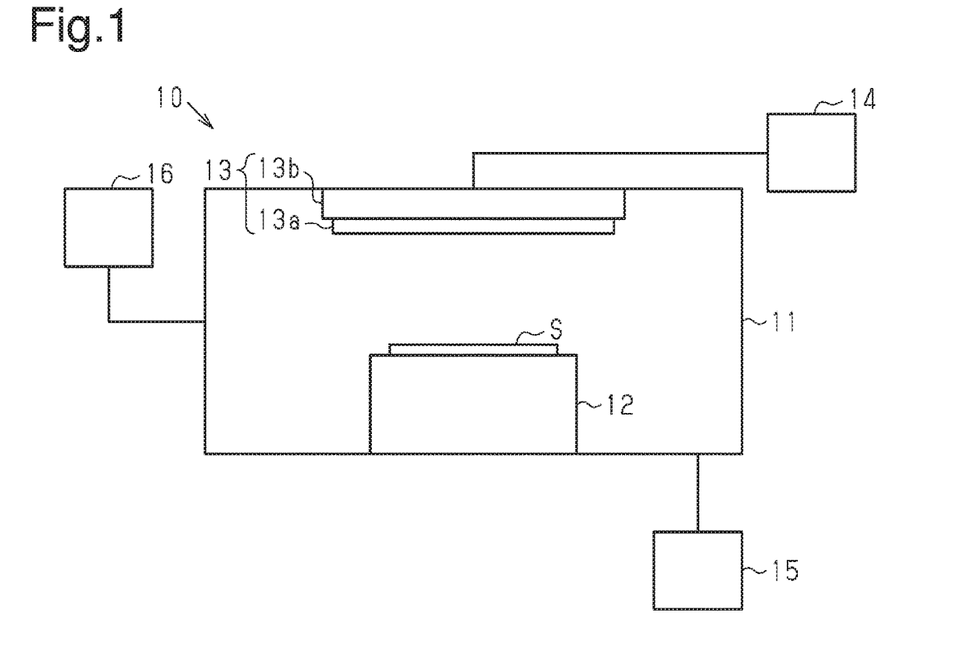
FIG. 1 is a block diagram showing a schematic configuration of a sputtering apparatus as an example of an apparatus used to form a semiconductor layer in an embodiment of a method for manufacturing a semiconductor device.
Figure 2:
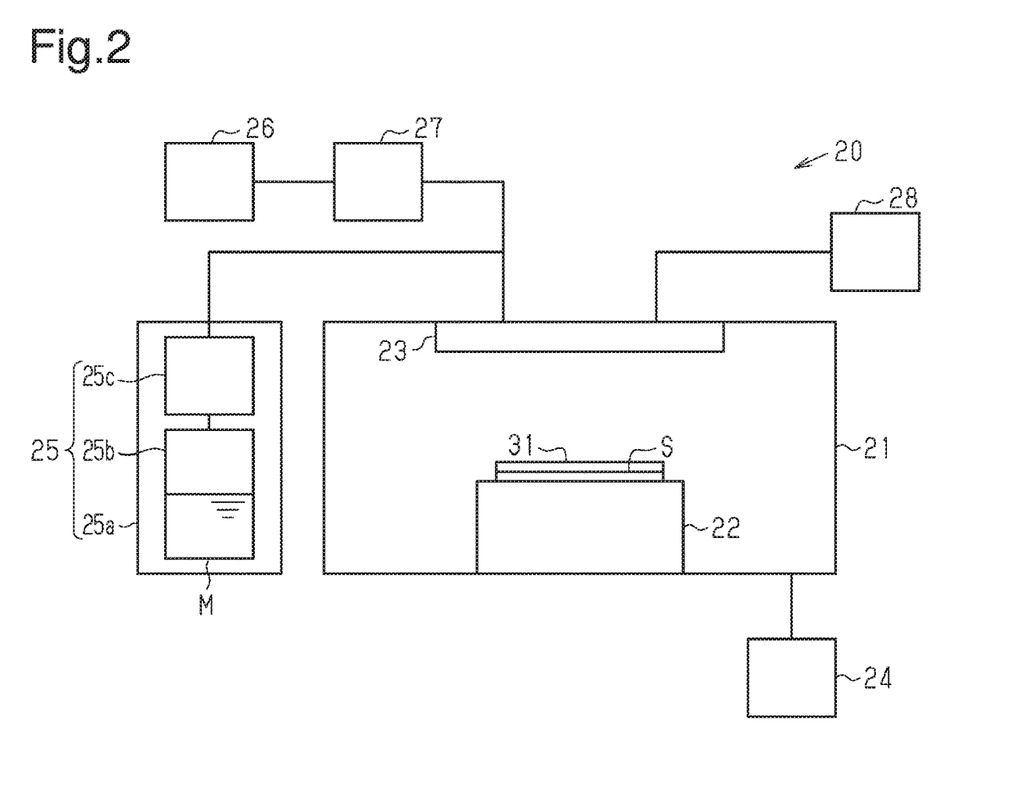
FIG. 2 is a block diagram showing a schematic configuration of a plasma CVD apparatus as an example of an apparatus used to form an insulator layer.

As shown in FIG. 1, a sputtering apparatus 10 includes a vacuum chamber 11 defining a film formation space in which a semiconductor layer is formed. A support 12 is arranged in the vacuum chamber 11 to support a film formation subject S, on which a semiconductor layer is formed. The support 12 is, for example, a stage that supports the film formation subject S.

A cathode 13 is arranged in the vacuum chamber 11 at a position opposed to the support 12 to form a semiconductor layer. The cathode 13 includes a target 13a and a backing plate 31b. The main component of the target 13a is an oxide semiconductor. Preferably, the oxide semiconductor is any one selected from a group consisting of InGaZnO(IGZO), GaZnO, InZnO, InTiZnO, InAlZnO, ZnTiO, ZnO, ZnAlO, and ZnCuO. Ninety mass percent or more of the target 13a is the oxide semiconductor.

The forming of a semiconductor layer may include forming a single semiconductor layer, the main component of which is any one selected from the group of oxide semiconductors described above or may include forming two or more semiconductor layers. More specifically, the forming of a semiconductor layer may include forming at least one semiconductor layer, the main component of which is an oxide semiconductor. In this case, each semiconductor layer includes any one selected from a group consisting of InGaZnO, GaZnO, InZnO, InTiZnO, InAlZnO, ZnTiO, ZnO, ZnAlO, and ZnCuO as a main component. More specifically, the main component of a semiconductor layer may be any one of an oxide semiconductor containing indium (In) and oxygen (O) and an oxide semiconductor containing zinc (Zn) and oxygen (O).

The backing plate 31b is formed from a metal. The material forming the backing plate 31b is, for example, copper. The above-described target 13a is fixed to the backing plate 31b. The cathode 33 does not have to be entirely arranged in the vacuum chamber 11 as long as at least a sputtering surface of the target 13a is exposed in the vacuum chamber 11.

The sputtering apparatus 10 includes a target power supply 14. The target power supply 14 is connected to the backing plate 31b. When the target power supply 14 applies voltage to the backing plate 31b, the voltage is applied to the target 13a through the backing plate 31b.

The sputtering apparatus 10 further includes a gas discharge portion 15 and a sputtering gas supply portion 16. The gas discharge portion 15 depressurizes the film formation space, which is defined by the vacuum chamber 11, to a predetermined pressure. The gas discharge portion 15 includes, for example, a pump and a valve. The sputtering gas supply portion 16 supplies the vacuum chamber 11 with a sputtering gas used to generate plasma for sputtering the target 13a. The sputtering gas supply portion 16 is, for example, a mass flow controller that supplies the sputtering gas at a predetermined flow rate and is connected to a bomb located outside the sputtering apparatus 10. The sputtering gas supplied from the sputtering gas supply portion 16 may be, for example, a noble gas such as argon gas or may be an oxygen-containing gas such as oxygen gas.

In the sputtering apparatus 10, when the film formation subject S is placed on the support 12, the gas discharge portion 15 depressurizes the film formation space to a predetermined pressure. After the sputtering gas supply portion 16 supplies the sputtering gas to the vacuum chamber 11, the target power supply 14 applies voltage to the target 13a through the backing plate 31b. Consequently, plasma is generated around the sputtering surface of the target 13a. Positive ions travel from the plasma toward the target 13a to sputter the sputtering surface of the target 13a. As a result, a semiconductor layer including an oxide semiconductor as a main component is formed on the film formation surface of the film formation subject S.

As shown in rig. 2, a plasma CVD apparatus 20 includes a vacuum chamber 21 defining a film formation space in which an insulator layer is formed. A support 22 is arranged in the vacuum chamber 21 to support the film formation subject S or which a semiconductor layer 31 is formed. The support 22 is, for example, a stage that supports a laminated body of the semiconductor layer 31 and the film formation subject S.

In the vacuum chamber 21, a dispersion portion 23 is arranged at a position opposed to the support 22. The dispersion portion 23 functions to disperse gas to form an insulator layer in the vacuum chamber 21. The dispersion portion 23 is, for example, a metal shower plate. The dispersion portion 23 is also an example of an electrode that is included in the plasma CVD apparatus 20.

The plasma CVD apparatus 20 includes a gas discharge portion 24. The gas discharge portion 24 depressurizes the film formation space, which is defined by the vacuum chamber 21, to a predetermined pressure. In the same manner as the gas discharge portion 15 of the sputtering apparatus 10, the gas discharge portion 24 includes, for example, a pump and a valve.

The plasma CVD apparatus 20 further includes a film formation gas supply unit 25, an oxygen-containing gas supply portion 26, a heater 27, and a high frequency power supply 28. The film formation gas supply unit 25 includes a constant temperature bath 25a, a reservoir 25b, and a film formation gas supply portion 25c. The constant temperature bath 25a defines an accommodation space accommodating the reservoir 25b and the film formation gas supply portion 25c and maintains the temperature of the accommodation space at a predetermined temperature. The reservoir 25b stores a film formation material M that is in a liquid state. The film formation material M is at vapor-liquid equilibrium in the reservoir 25b. The film formation gas supply portion 25c is a mass flow controller that is connected to the vacuum chamber 21 to supply the evaporated film formation material M to the vacuum chamber 21 at a predetermined flew rate. The film formation gas supply portion 25c supplies the gas of the film formation material M to the vacuum chamber 21 at a flow rate that is, for example, greater than or equal to 0.005 sccm/cm$^2$ and less than or equal to 0.1 sccm/cm$^2$.

The film formation material M is, for example, tetraisocyanatesilane (Si(NCO)$_4$: TICS). The plasma CVD apparatus 20 forms an insulator layer through a plasma CVD process using tetraisocyanatesilane and oxygen. Tetraisocyanatesilane, which is the material of the insulator layer, does not contain hydrogen. This increases the reliability of the hydrogen atom concentration of the insulator layer being less than or equal to $1 \times 10^{21}$ atoms/cm$^3$.

The film formation material M is not limited to Si(NCO)$_4$ and may be a material that contains silicon (Si) and an isocyanate group (NCO) and does not contain hydrogen. The film formation material M may be, for example, any one of Si(NCO)$_3$Cl, Si(NCO)$_2$Cl$_2$, and Si(NCO)Cl$_3$. In the plasma CVD apparatus 20, the source gas, which is obtained by evaporating the film formation material M, is supplied to the vacuum chamber 21. More specifically, in the forming of an insulator layer, any one selected from a group consisting of Si(NCO)$_4$, Si(NCO)$_3$Cl, Si(NCO)$_2$Cl$_2$, and Si(NCO)Cl$_3$ may be used as the source gas.

The oxygen-containing gas supply portion 26 is connected to the vacuum chamber 21 via the heater 27. The oxygen-containing gas supply portion 26 is, for example, a mass flow controller that is connected to a bomb located outside the plasma CVD apparatus 20 to supply oxygen gas (O$_2$) to the vacuum chamber 21 at a predetermined flow rate. The heater 27 heats the oxygen gas discharged from the oxygen-containing gas supply portion 26 to a predetermined temperature. The heater 27 heats the oxygen gas to a temperature that is, for example, higher than or equal to 50° C. and lower than or equal to 200° C.

The oxygen-containing gas supply portion 26 may supply any one of O$_3$, N$_2$O, CO, and CO$_2$ instead of O$_2$ as the oxygen-containing gas. More specifically, the forming of an insulator layer may include using any one selected from a group consisting of O$_2$, O$_3$, N$_2$O, CO, and CO$_2$ as the oxygen-containing gas.

The oxygen-containing gas supplied from the oxygen-containing gas supply portion 26 may be attenuated by an inert gas and supplied to the vacuum chamber 21. The inert gas may be, for example, N$_2$/He, Ne, Ar, Kr, or Xe.

When the high frequency power supply 28, which is connected to the dispersion portion 23, supplies power to the dispersion portion 23, a mixed gas of tetraisocyanatesilane gas and oxygen gas generates plasma around the dispersion portion 23 in the vacuum chamber 21. The high frequency power supply 28 supplies the dispersion portion 23 with high frequency power having a frequency of, for example, 13.56 MHz or 27.12 MHz at a level of greater than or equal to 0.07 W/cm$^2$ and less than or equal to 1.5 W/cm$^7$.

It is preferred that when the insulator layer is formed, the ratio of power to the flow rate of the tetraisocyanatesilane gas be greater than or equal to 17 W/sccm. This increases the reliability of forming an insulator layer having a hydrogen atom concentration that is less than or equal to $1 \times 10^{21}$ atoms/cm$^3$.

In the plasma CVD apparatus 20, when the film formation subject S on which the semiconductor layer 31 is formed is placed on the support 22, the gas discharge portion 24 depressurizes the vacuum chamber 21 to a predetermined pressure. After the film formation gas supply portion 25c supplies the tetraisocyanatesilane gas to the vacuum chamber 21 and the oxygen-containing gas supply portion 26 supplies oxygen gas to the vacuum chamber 21, the high frequency power supply 28 supplies power to the dispersion portion 23. As a result, plasma is generated around the dispersion portion 23 from the mixed gas described above. Active species in the plasma reach the semiconductor layer 31 to form an insulator layer including silicon oxide as the main component on the semiconductor layer 31.

As described above. In an embodiment, the forming of an insulator layer may include generating a mixed gas by supplying tetraisocyanatesilane gas and oxygen gas to the film formation space, in which the insulator layer is formed, and generating plasma from the mixed gas by supplying power to the dispersion portion 23, which is an example of an electrode arranged in the film formation space. In such an embodiment, from the point in time when the plasma is generated, active species that are generated from tetraisocyanatesilane gas is oxidized by active species that are generated from the oxygen gas.

[Thin-Film Transistor Structure]

The structure of a semiconductor device will now be described with reference to FIG. 3.

Figure 3:
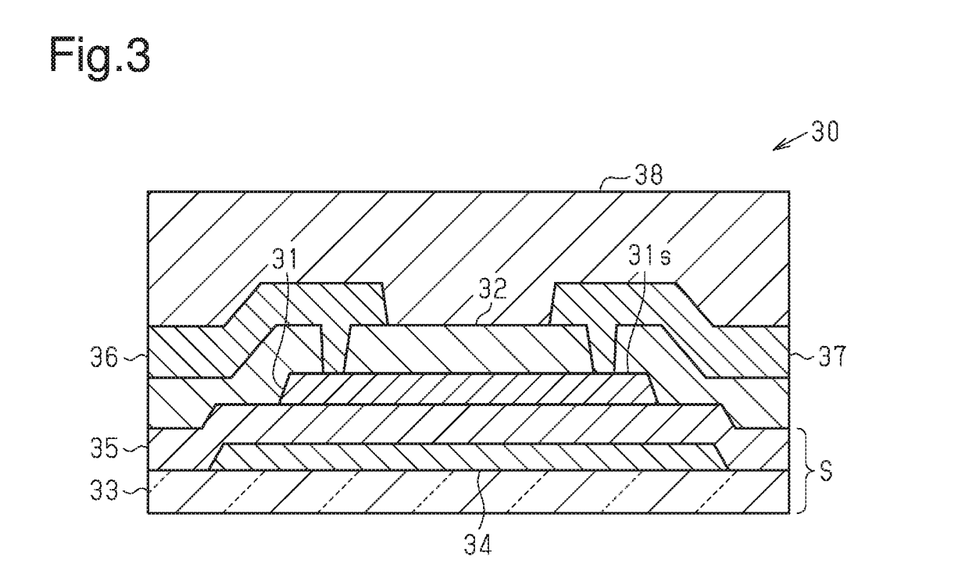
FIG. 3 is a cross-sectional view showing a cross-sectional structure of a semiconductor device in an embodiment of a thin-film transistor.

FIG. 3 shows a thin-film transistor 30, which is an example of a semiconductor device, including the semiconductor layer 31 and an insulator layer 32. The semiconductor layer 31 includes a surface 31s. The semiconductor layer 31 includes an oxide semiconductor as a main component. In the same manner as the target 13a, 90 mass percent or more of the semiconductor layer 31 is the oxide semiconductor.

The insulator layer 32 is arranged on the surface 313 of the semiconductor layer 31. The insulator layer 32 includes silicon oxide as a main component and has a hydrogen atom concentration that, is less than or equal to $1 \times 10^{21}$ atoms/cm$^3$. The insulator layer 32 covers the surface 31s of the semiconductor layer 31 and a portion of a gate insulator layer 35 that is not covered by the semiconductor layer 31.

In the present embodiment, a single semiconductor layer is described as an example of the semiconductor layer 31. However, the semiconductor layer 31 may include at least one semiconductor layer. More specifically, the semiconductor layer 31 may include two or more semiconductor layers. It is preferred that the main component of each semiconductor layer be any one selected from a group consisting of InGaZnO, GaZnO, InZnO, InTiZnO, InAlZnO, ZnTiO, ZnO, ZnAlO, and ZnCuO.

The thin-film transistor 30 includes the film formation subject S described above. The film formation subject S includes a substrate 33, a gate electrode 34, and the gate insulator layer 35. The gate electrode 34 is arranged on a portion of the surface of the substrate 33. The gate insulator layer 35 covers the entire gate electrode 34 and the surface of the substrate 33 that, is not covered by the gate electrode 34. The substrate 33 may be, for example, a resin substrate formed from various resins or a glass substrate. For example, molybdenum may be used as the material forming the gate electrode 34. The gate insulator layer 35 may be, for example, e silicon oxide layer or a laminated body of a silicon oxide layer and a silicon nitride layer.

The semiconductor layer 31 is arranged on the surface of the gate insulator layer 35 so that the semiconductor layer 31 overlaps the gate electrode 34 in a direction in which the layers of the thin-film transistor 30 are stacked. The thin-film transistor 30 further includes a source electrode 36 and a drain electrode 37. The source electrode 36 and the drain electrode 37 are arranged next to each other with a predetermined gap between them in an arrangement direction (sideward direction in FIG. 3) extending along a cross section of the thin-film transistor 30. The source electrode 36 covers a portion of the insulator layer 32. The drain electrode 37 covers another portion of the insulator layer 32. The source electrode 36 and the drain electrode 37 are each electrically connected to the semiconductor layer 31 by contact holes extending into the insulator layer 32. For example, molybdenum or aluminum may be used as the material forming the source electrode 36 and the material forming the drain electrode 37.

The thin-film transistor 30 further includes a protective film 38. The protective film 33 covers the source electrode 36, the drain electrode 37, and the insulator layer 32 that is exposed from both the source electrode 36 and the drain electrode 37. For example, silicon oxide may be used as the material forming the protective film 38.

Test Examples

Test Examples will now be described with reference to FIGS. 4 to 12.

[Laminated Body Structure]

The structure of a test example of a laminated body 40 will now be described with reference to FIG. 4.

Figure 4:
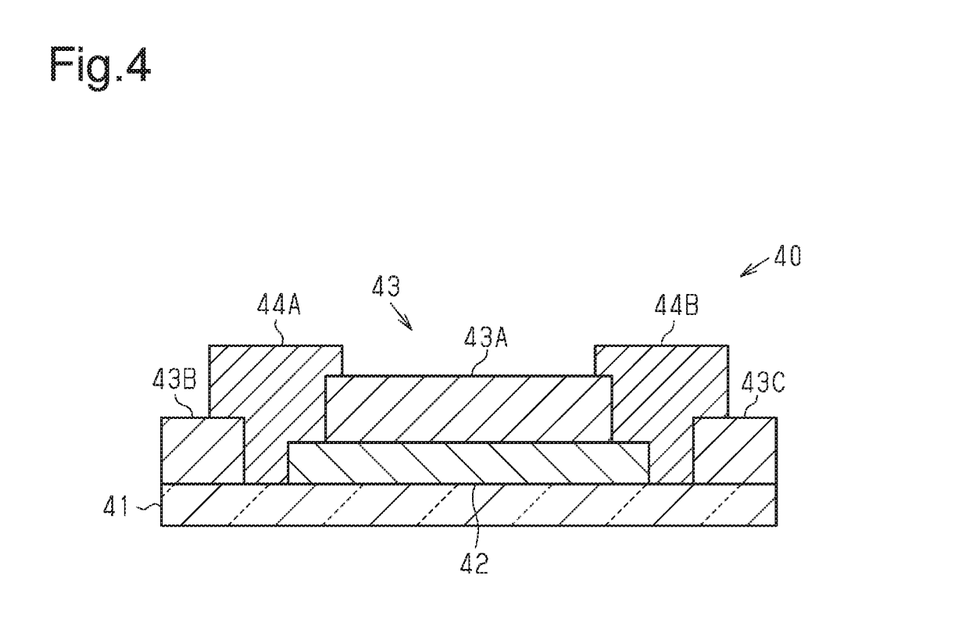
FIG. 4 is a cross-sectional view showing a cross-sectional structure of a laminated body that is obtained in a test example.

In the test example, the laminated body 40, which will be described below with reference to FIG. 4, is used to evaluate the effect of hydrogen atoms included in an insulator layer on a semiconductor layer.

As shown in FIG. 4, the laminated body 40 includes a glass substrate 41, a semiconductor layer 42 arranged on a portion of the surface of the class substrate 41, and an insulator layer 43. The insulator layer 43 is arranged on a portion of the surface of the semiconductor layer 42 and a surface of the glass substrate 41 that is not covered by the semiconductor layer 42. The insulator layer 43 includes a first part 43A arranged on the surface of the semiconductor layer 42, a second part 43B, and a third part 43C. The second part 43B and the third part 43C are located at opposite sides of the first part 43A in an arrangement direction (sideward direction in FIG. 4) extending along a cross section of the laminated body 40.

A first electrode layer 44A is arranged between the first part 43A and the second part 43B in the arrangement direction. The first electrode layer 44A covers a portion of the semiconductor layer 42, a portion of the first part 43A, and a portion of the second part 43B. A second electrode layer 44B is arranged between the first part 43A and the third part 43C in the arrangement direction. The second electrode layer 44B covers a portion of the semiconductor layer 42, a portion of the first part 43A, and a portion of the third part 43C.

The main component of the semiconductor layer 42 is IGZO, and the main component of the insulator layer 43 is $SiO_2$. The thickness of the semiconductor layer 42 is 50 nm. The thickness of the insulator layer 43 is 100 nm. The material forming the first electrode layer 44A and the second electrode layer 44B is Mo.

To form the laminated body 40, a semiconductor layer is first formed on the surface of the glass substrate 41, and the semiconductor layer is etched via a mask to form the semiconductor layer 42. Then, a plasma CVD process is performed to form an insulator layer on the entire surface of the semiconductor layer 42 and a portion of the surface of the glass substrate 41 that is not covered by the semiconductor layer 42. The insulator layer is etched via a mask to form the insulator layer 43 that includes the first part 43A, the second part 43B, and the third part 43C. Subsequently, a metal layer is formed to cover the semiconductor layer 42 and the first part 43A, the second part 43B, and the third part 43C of the insulator layer 43. The metal layer is etched via a mask to form the first electrode layer 44A and the second electrode layer 44B.

[Film Formation Condition]

The semiconductor layer 42 and the insulator layer 43 of the laminated body 40 are formed under the following conditions.

[Semiconductor Layer]

| | |
|---|---|
| Target | InGaZnO |
| Sputtering Gas | Argon Gas/Oxygen Gas |
| Sputtering Gas Flow Rate | 80 sccm/6 sccm |
| Pressure of Film Formation Space | 0.3 Pa |
| Power Applied to Target | 240 W |
| Area of Target | 81 $cm^2$ (diameter 4 inches) |

[Insulator Layer]

| | |
|---|---|
| Film Formation Gas | Tetraisocyanatesilane (TICS) |
| Film Formation Gas Flow Rate | 55 sccm |
| Oxygen Gas Flow Rate | 2500 sccm |
| Pressure of Film Formation Space | 175 Pa |
| High Frequency Power | 400 W or higher and 4000 W or lower |
| Area of Electrode | 2700 $cm^2$ |

[Evaluation]
[Concentration of Each Atom]

When insulator layers were formed, the value of high frequency power was changed in a range from 400 W to 4000 W to obtain a number of laminated bodies that differ from each other in the value of high frequency power when the insulator layers are formed. The hydrogen atom concentration (atoms/$cm^3$), the carbon atom concentration (atoms/$cm^3$), and the oxygen atom concentration (atoms/$cm^3$) were measured in the insulator layer of each laminated body. A secondary ion mass spectrometry (ADEPT1010, manufactured by ALVAC-PHI Inc.) was used to measure the concentration of each atom.

Figure 5:
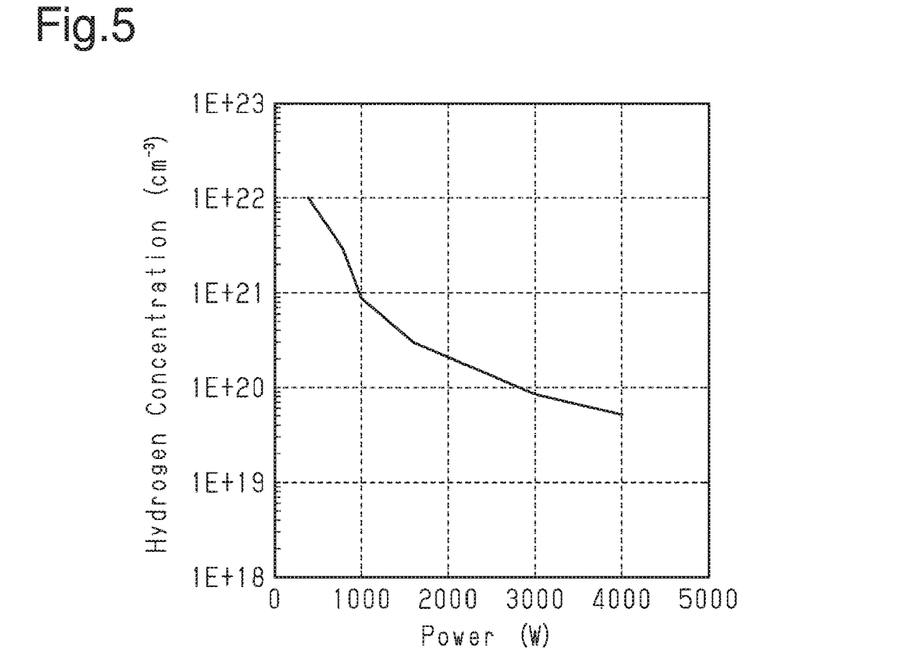
FIG. 5 is a graph showing the relationship between high frequency power and hydrogen atom concentration of an insulator layer.

FIG. 5 shows that when the insulator layer 43 is formed, the hydrogen atom concentration of the insulator layer 43 lowers as the high frequency power increases. For example, the hydrogen atom concentration of the insulator layer 43 is $1\times10^{22}$ atoms/$cm^3$ when high frequency power is 400 W, $3\times10^{21}$ atoms/$cm^3$ when high frequency power is 800 W, $10^{20}$ atoms/$cm^3$ when high frequency power is 1000 W, and $2\times10^{20}$ atoms/$cm^3$ when high frequency power is 1600 W. FIG. 5 also shows that the hydrogen atom concentration is $9\times10^{19}$ atoms/$cm^3$ when high frequency power is 3000 W, and $5\times10^{19}$ atoms/$cm^3$ when high frequency power is 4000 W.

As described above, the flow rate of the film formation gas is 55 scan. Thus, when high frequency power is 400 W, the ratio of the flow rate of the film formation gas to the high frequency power is 7 W/sccm. When high frequency power is 800 W, the ratio of the flow rate of the film formation gas to the high frequency power is 15 W/sccm. When high frequency power is 1000 W, the ratio of the flow rate of the film formation gas to the high frequency power is 18 W/sccm. When high frequency power is 1600 W, the ratio of the flow rate of the film formation gas to the high frequency power is 29 W/sccm. When high frequency power is 3000 W, the ratio of the flow rate of the film formation gas to the high frequency power is 55 W/sccm. When high frequency power is 4000 W, the ratio of the flow rate of the film formation gas to the high frequency power is 72 W/sccm. The measurement results of the hydrogen atom concentration verifies that when the ratio of the flow rate of the film formation gas to the high frequency power is greater than or equal to 17 W/sccm, the reliability of the hydrogen atom concentration of the insulator layer being less than or equal to $1\times10^{21}$ atoms/$cm^3$ increases.

It is also verified that when tetraethoxysilane gas (TECS) is used as the film formation gas to form an insulator layer, the hydrogen atom concentration of the insulator layer is $4\times10^{21}$ atoms/$cm^3$, and that when silane gas ($SiH_4$) is used as the film formation gas to form an insulator layer, the hydrogen gas concentration of the insulator layer 43 is $2\times10^{21}$ atoms/$cm^3$. The film formation conditions using each of TEOS gas and $SiH_4$ gas were set as follows.

[TEOS]

| | |
|---|---|
| Film Formation Gas | Tetraethoxysilane (TEOS) |
| Film Formation Gas Flow Rate | 100 sccm |
| Oxygen Gas Flow Rate | 5000 sccm |
| Pressure of Film Formation Space | 175 Pa |
| High Frequency Power | 1600 W |
| Area of Electrode | 2700 $cm^2$ |

[$SiH_4$]

| | |
|---|---|
| Film Formation Gas | Silane ($SiH_4$) |
| Film Formation Gas Flow Rate | 70 sccm |
| $N_2O$ Gas Flow Rate | 3500 sccm |
| Pressure of Film Formation Space | 200 Pa |
| High Frequency Power | 800 W |
| Area of Electrode | 2700 $cm^2$ |

Figure 6:
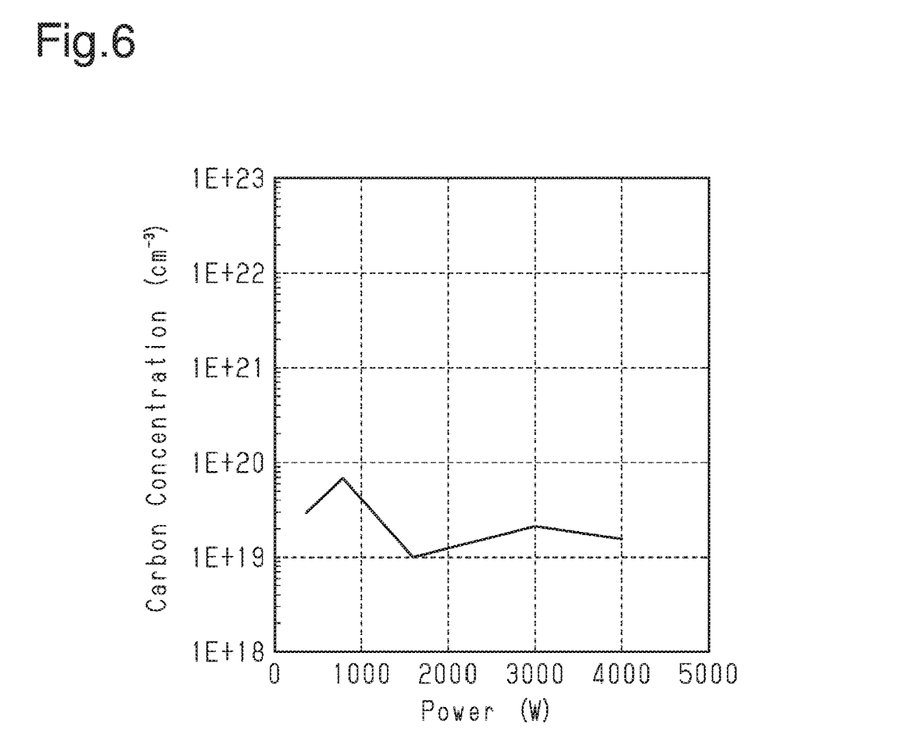
FIG. 6 is a graph showing the relationship between high frequency power and carbon atom concentration of an insulator layer.

FIG. 6 shows that when the insulator layer 43 is formed, the concentration of carbon atoms in the insulator layer 43 has a small dependency on the amount of high frequency power. The carbon atom concentration of the insulator layer 43 is $3\times10^{19}$ atoms/$cm^3$ when high frequency power is 400 W, $7\times10^{19}$ atoms/$cm^3$ when high frequency power is 800 W, and $4\times10^{19}$ atoms/$cm^3$ when high frequency power is 1000 N. Additionally, the carbon atom concentration is $1\times10^{19}$ atoms/$cm^3$ when high frequency power is 1600 W, $2\times10^{19}$ atoms/$cm^3$ when high frequency power is 3000 W, and $2\times10^{19}$ atoms/$cm^3$ when high frequency power is 4000 W.

Figure 7:
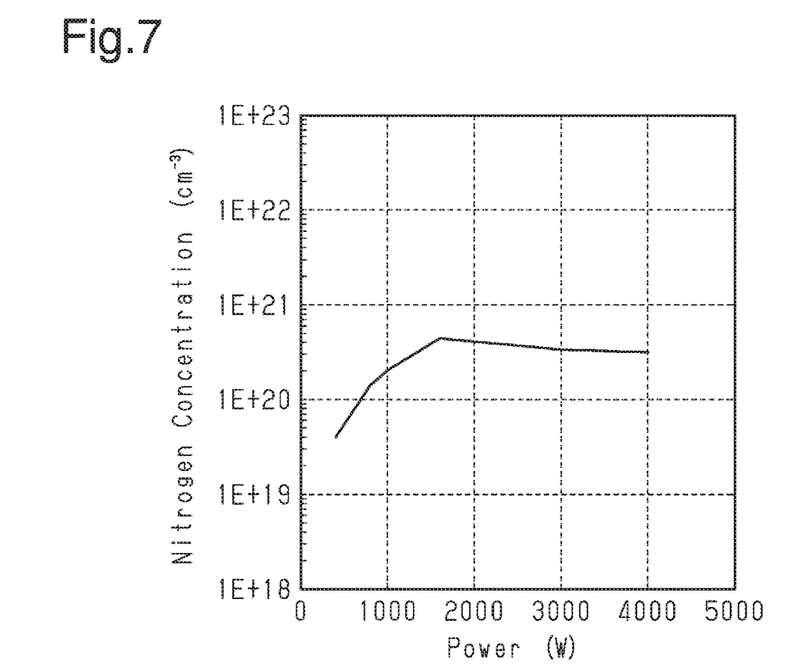
FIG. 7 is a graph showing the relationship between high frequency power and nitrogen atom concentration of an insulator layer.

FIG. 7 shows that when high frequency power is less than 1600 W and the insulator layer 43 is formed, the concentration of nitrogen atoms in the insulator layer 43 increases as high frequency power increases, and that when high frequency power is greater than or equal to 1600 W, the nitrogen atom concentration has a small dependency on the amount of the high frequency power. For example, the nitrogen atom concentration of the insulator layer 43 is $4\times10^{19}$ atoms/cm$^3$ when high frequency power is 400 W, $2\times10^{20}$ atoms/cm$^3$ when high frequency power is 800 W, and $2\times10^{20}$ atoms/cm$^3$ when high frequency power is 1000 W. Additionally, the concentration of nitrogen atom is $4\times10^{20}$ atoms/cm$^3$ when high frequency power is 1600 W, $3\times10^{20}$ atoms/cm$^3$ when high frequency power is 3000 W, and $3\times10^{20}$ atoms/cm$^3$ when high frequency power is 4000 W.

[Refractive Index]

The refractive index of the insulator layer of each laminated body was measured. A spectroscopic ellipsometer (M-2000V, manufactured by J. A. Woollam Co., Inc.) was used to measure the refractive index.

Figure 8:
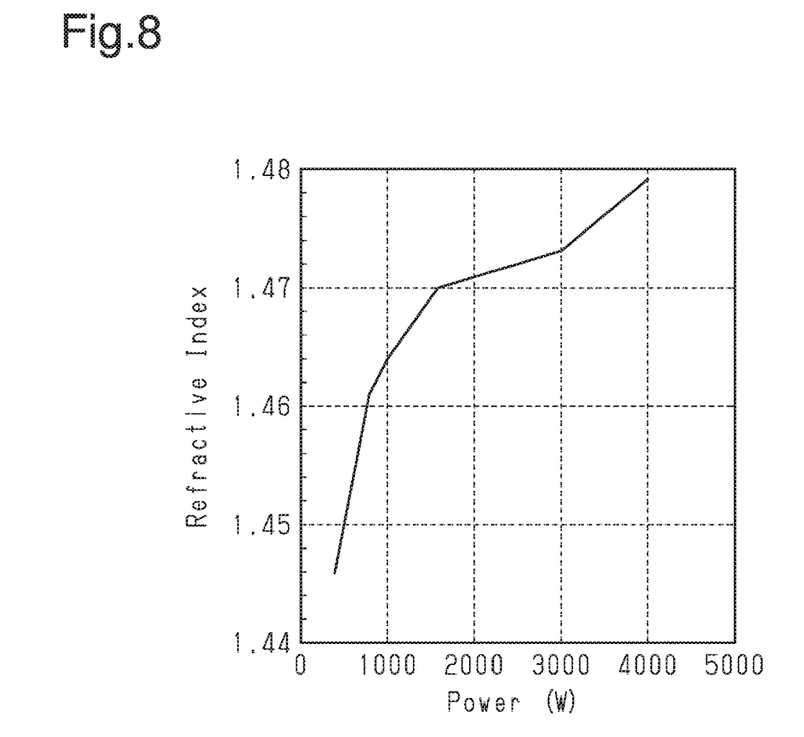
FIG. 8 is a graph showing the relationship between high frequency power and the refractive index in an insulator layer.

FIG. 8 shows that when the insulator layer 43 is formed, the refractive index of the insulator layer 43 increases as high frequency power increases. For example, the refractive index of the insulator layer 43 is 1.446 when high frequency power is 400 W, 1.461 when high frequency power is 800 W, and 1.464 when high frequency power is 1000 W. Additionally, the refractive index is 1.470 when high frequency power is 1600 W, 1.473 when high frequency power is 3000 W, and 1.479 when high frequency power is 4000 W.

[Film Stress]

Film stress of the insulator layer of each laminated body was measured. A thin film stress measurement device (FLX-2000-A, manufactured by Toho Technology Inc.) was used to measure the film stress.

Figure 9:
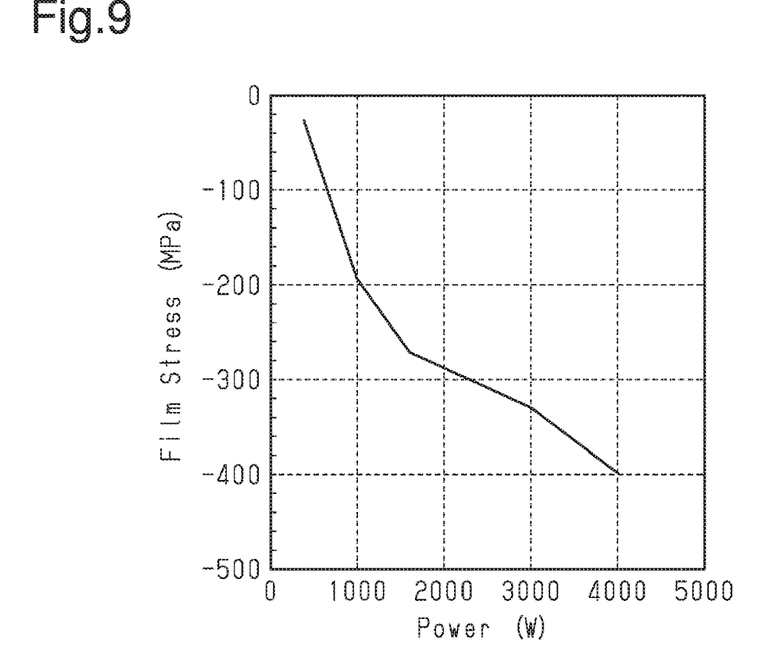
FIG. 9 is a graph showing the relationship between high frequency power and film stress in an insulator layer.

FIG. 9 shows that when the insulator layer 43 is formed, compression stress is generated in the insulator layer 43 regardless of the amount of high frequency power. Additionally, when the insulator layer 43 is formed, the absolute value of the compression stress in the insulator layer 43 increases as high frequency power increases. For example, the film stress in the insulator layer 43 is −30 MPa when high frequency power is 400 W, −140 MPa when high frequency power is 800 W, and −196 MPa when high frequency power is 1000 W. The film stress is −270 MPa when high frequency power is 1600 W, −330 MPa when high frequency power is 3000 W, and −398 MPa when high frequency power is 4000 W.

[Carrier Concentration]

The carrier concentration of the semiconductor layer of each laminated body was measured. A Hall effect measurement device (HL55001U, manufactured by Nanometrics Inc.) was used to measure the carrier concentration.

Figure 10:
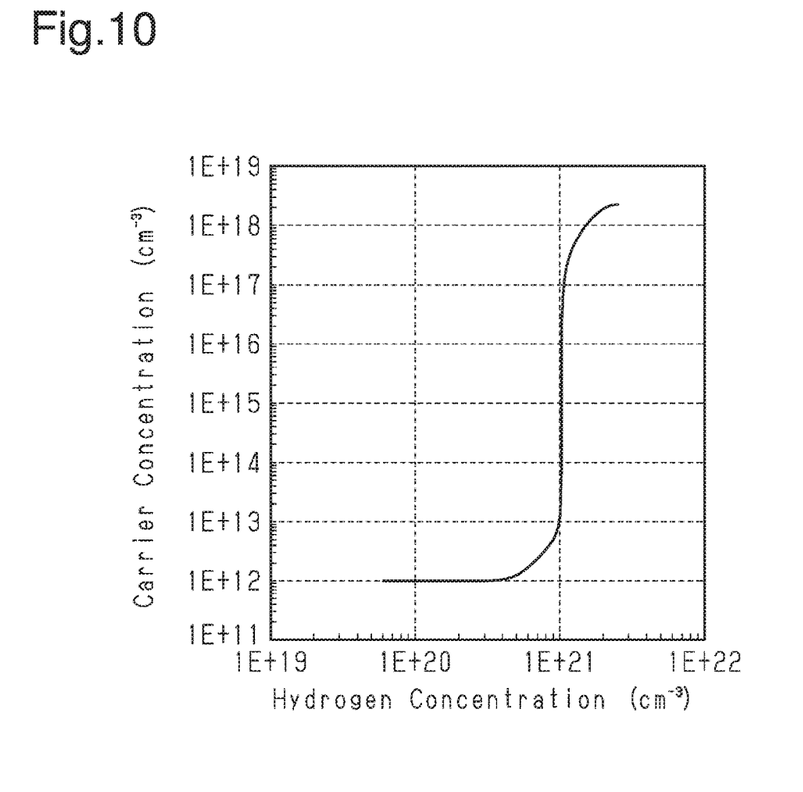
FIG. 10 is a graph showing the relationship between hydrogen atom concentration and carrier concentration an insulator layer.

FIG. 10 shows that when the hydrogen atom concentration of the insulator layer 43 is greater than $1\times10^{21}$ atoms/cm$^3$, the carrier concentration of the semiconductor layer 42 is greater than $1\times10^{16}$ atoms/cm$^3$. On the other hand, when the hydrogen atom concentration of the insulator layer 43 is less than or equal to $1\times10^{21}$ atoms/cm$^3$, the carrier concentration of the semiconductor layer 42 is less than $1\times10^{13}$ atoms/cm$^3$. More specifically, when the hydrogen atom concentration of the insulator layer 43 is less than or equal to $1\times10^{21}$ atoms/cm$^3$, the carrier concentration of the semiconductor layer 42 is significantly lower than when the hydrogen atom concentration is greater than $1\times10^{21}$ atoms/cm$^3$. It is considered that these results are obtained because the deficiency of oxygen caused by reduction of the semiconductor layer 42, which is a lower layer of the insulator layer 43, is significantly limited by the hydrogen atom concentration of the insulator layer 43 that is less than or equal to $1\times10^{21}$ atoms/cm$^3$.

EXAMPLES

First Example

A first example of a thin-film transistor was formed. The thin-film transistor has the structure that has been described with reference to FIG. 3 and includes a gate electrode, a gate insulator layer, a semiconductor layer, an insulator layer, a source electrode, a drain electrode, and a protective film. In the thin-film transistor of the first example, the film formation condition of the insulator layer was the same as that of the test example using TICS, and the film formation condition of the semiconductor layer was the same as that of the test example. However, when the insulator layer was formed, high frequency power was set to 1600 W. Additionally, in the thin-film transistor of the first example, molybdenum was used as the material forming the gate electrode, the source electrode, and the drain electrode. Silicon oxide was used as the material forming the gate insulator layer. Silicon oxide was used as the material forming the protective film.

First Comparative Example

A first comparative example of a thin-film transistor was formed using the same process as the first example except that the film formation condition of the insulator layer was the same as that of the test example using SiH$_4$.

[Evaluation]

A semiconductor parameter analyzer (4155C, manufactured by Agilent Technologies) was used to measure transistor characteristics, that is, voltage (Vg)-current (Id) characteristics, of the thin-film transistor of the first example and the thin-film transistor of the first comparative example. The conditions for measuring the transistor characteristics were set as follows.

| Source Voltage | 0 V |
| Drain Voltage | 5 V |
| Gate Voltage | from −15 V to 20 V |
| Glass Substrate Temperature | Room Temperature |

Figure 11:
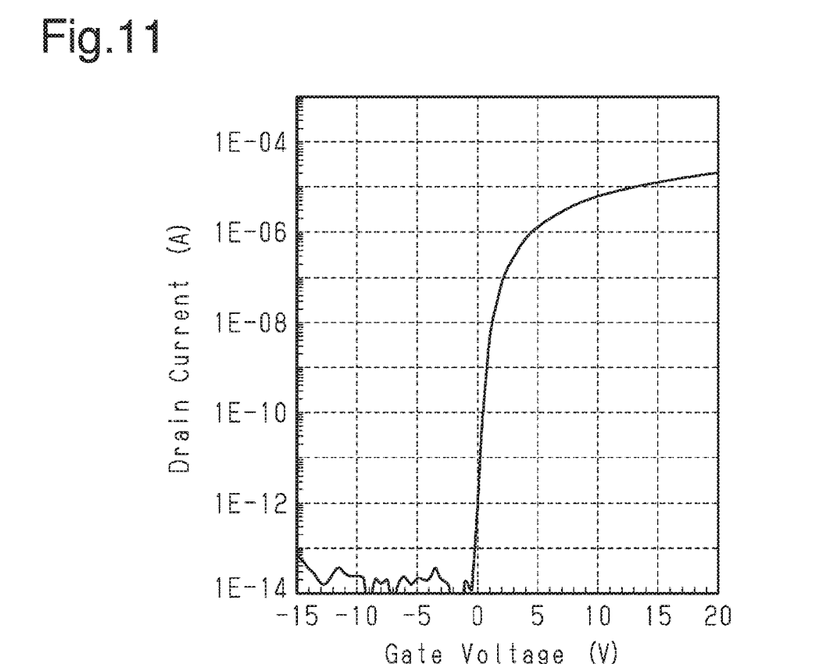
FIG. 11 is a graph showing voltage-current characteristics of a first example of a thin-film transistor.

As shown in FIG. 11, in the thin-film transistor of the first example, the threshold voltage was 5.3 V, the activation voltage was 0.66 V, the electron mobility was 10.2 V/cm$^2$·cec, and the subthreshold swing value was 0.31 V/decade. The activation voltage refers to the gate voltage when the drain current is $10^{-9}$ A/cm$^2$. This verifies that the thin-film transistor of the first example, that is, a thin-film transistor including an insulator layer having a hydrogen atom concentration that is less than or equal to $1\times10^{21}$ atoms/cm$^3$, normally operates. In other words, the transistor characteristics are stable.

Figure 12:
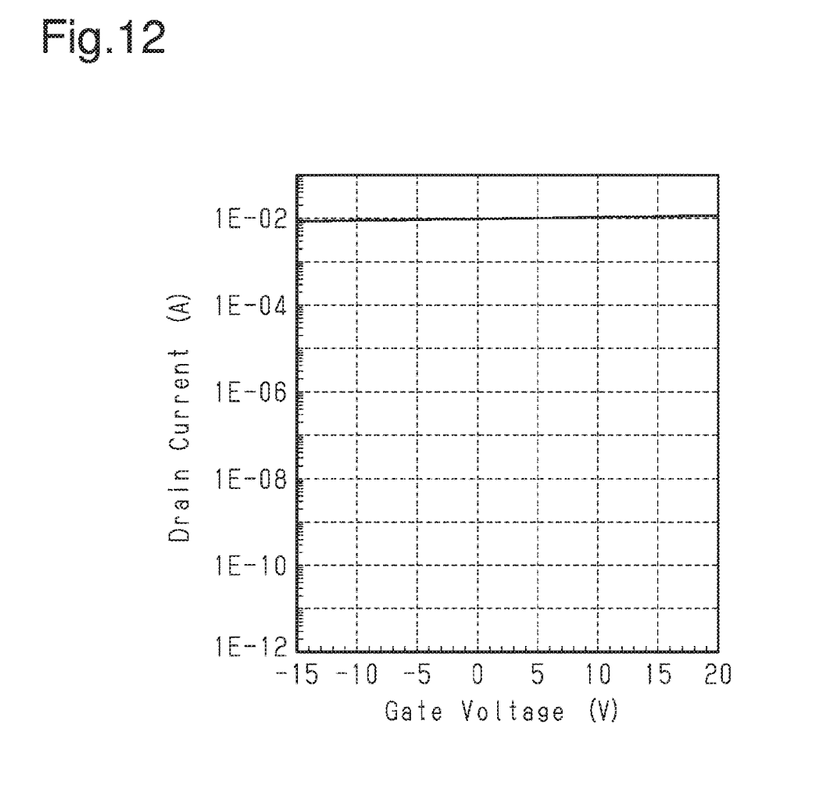
FIG. 12 is a graph showing voltage-current, characteristics of a first comparative example of a thin-film transistor.

On the other hand, as shown in FIG. 12, the thin-film transistor of the first comparative example, that is, a thin-film transistor including an insulator layer having a hydrogen atom concentration that is greater than $1\times10^{21}$ atoms/cm$^3$, does not normally operate. In other words, the transistor characteristics are unstable.

As described above, the embodiments of the semiconductor device and the method for manufacturing the semiconductor device have the advantages described below.

(1) The insulator layer 32 having a hydrogen atoms concentration that is less than or equal to $1\times10^{21}$ atoms/cm$^3$ is formed. This stabilizes the characteristics of the thin-film transistor 30.

(2) Tetraisocyanatesilane (TICS), which is the material of the insulator layer 32, does not include hydrogen. This increases the reliability of the hydrogen atom concentration of the insulator layer 32 being less than or equal to $1\times10^{21}$ atoms/cm).

(3) From the point in time when the plasma is generated, active species that are generated from tetraisocyanatesilane gas is oxidized by active species that are generated from oxygen gas.

(4) When the ratio of power supplied to the dispersion portion 23 to the flow rate of tetraisocyanatesilane gas is greater than or equal to 17 W/sccm, the reliability of the hydrogen atom concentration of the insulator layer being less than or equal to atoms/cm$^3$ increases.

The embodiments may be modified as follows.

The semiconductor device is not limited to the thin-film transistor 30 described above and may include a semiconductor element other than the thin-film transistor 30.

The invention claimed is:

1. A method for manufacturing a semiconductor device, the method comprising:
    forming a semiconductor layer having a surface and including an oxide semiconductor as a main component; and
    forming an insulator layer on the surface of the semiconductor layer through a plasma CVD process using a source gas and an oxygen-containing gas, wherein:
    the insulator layer includes silicon oxide as a main component and has a hydrogen atom concentration that is less than or equal to $1\times10^{21}$ atoms/cm$^3$;
    the source gas contains silicon and an isocyanate group and does not contain hydrogen; and
    the forming of the insulator layer includes:
        setting a flow rate of the source gas to be greater than or equal to 0.005 sccm/cm$^2$ and less than or equal to 0.1 sccm/cm$^2$;
        generating a mixed gas by supplying the source gas and the oxygen-containing gas to a film formation space in which the insulator layer is formed;
        generating plasma from the mixed gas by supplying high frequency power to an electrode arranged in the film formation space, the high frequency power having a frequency of 13.56 MHz or 27.12 MHz at a level of greater than or equal to 0.07 W/cm$^2$ and less than or equal to 1.5 W/cm$^2$; and
        setting a ratio of the high frequency power supplied to the electrode to the flow rate of the source gas to be greater than or equal to 17 W/sccm and less than or equal to 72 W/sccm.

2. The method according to claim 1, wherein:
    the forming of the semiconductor layer includes forming at least one semiconductor layer including an oxide semiconductor as a main component, and
    the main component of the at least one semiconductor layer is any one of:
        an oxide semiconductor including indium (In) and oxygen (O); and
        an oxide semiconductor including zinc (Zn) and oxygen (O).

3. The method according to claim 1, wherein the forming of the semiconductor layer includes forming at least one semiconductor layer including an oxide semiconductor as a main component, and the main component of the at least one semiconductor layer is any one selected from a group consisting of InGaZnO, GaZnO, InZnO, InTiZnO, InAlZnO, ZnTiO, ZnO, ZnAlO, and ZnCuO.

4. The method according to claim 1, wherein the forming of the insulator layer includes using any one selected from a group consisting of Si(NCO)$_4$, Si(NCO)$_3$Cl, Si(NCO)$_2$Cl$_2$, and Si(NCO)Cl$_3$ as the source gas.

5. The method according to claim 1, wherein the forming of the insulator layer includes using any one selected from a group consisting of O$_2$, O$_3$, N$_2$O, CO, and CO$_2$ as the oxygen-containing gas.

* * * * *